United States Patent
Feinstein

(10) Patent No.: US 6,701,003 B1
(45) Date of Patent: Mar. 2, 2004

(54) COMPONENT IDENTIFICATION SYSTEM FOR ELECTRONIC BOARD TESTERS

(75) Inventor: David Y. Feinstein, Bellaire, TX (US)

(73) Assignee: Innoventions, Inc., Houston, TX (US)

( * ) Notice: Subject to any disclaimer, the term of this patent is extended or adjusted under 35 U.S.C. 154(b) by 0 days.

(21) Appl. No.: 09/546,268

(22) Filed: Apr. 10, 2000

(51) Int. Cl.[7] ............................................... G06K 9/00
(52) U.S. Cl. ...................... 382/147; 382/199; 382/305; 702/108; 702/90; 714/42; 714/799
(58) Field of Search ............................... 382/147, 144, 382/149, 152, 181, 190, 199, 203, 266, 305; 714/724, 42, 718, 26, 25, 33, 44, 703, 715, 799; 702/108, 117, 118, 90; 703/14, 17, 22; 706/916

(56) References Cited

U.S. PATENT DOCUMENTS

| | | | | |
|---|---|---|---|---|
| 4,907,230 A | * | 3/1990 | Heller et al. ................... 714/26 |
| 6,161,052 A | * | 12/2000 | Charlton et al. ............. 714/718 |
| 6,226,760 B1 | * | 5/2001 | Burkhardt et al. ............. 714/33 |
| 6,289,292 B1 | * | 9/2001 | Charlton et al. ............. 702/108 |
| 6,357,023 B1 | * | 3/2002 | Co et al. ....................... 714/42 |
| 6,385,739 B1 | * | 5/2002 | Barton et al. .................. 714/25 |
| 6,389,688 B1 | * | 5/2002 | Srivastava et al. ............. 29/833 |
| 6,477,266 B1 | * | 11/2002 | Asar ........................... 382/147 |

* cited by examiner

Primary Examiner—Bhavesh M. Mehta
Assistant Examiner—Sheela Chawan

(57) ABSTRACT

A method and system for component identification system for electronic board tester to identify the actual defective components in a failed board is disclosed. It uses image captures of the front side and backside of the tested board to extract an outline diagram that is compared to a database of outline diagrams of known boards until a match is found. Each outline diagram in the database is associated with a connection list between the standard connector of the board and the individual components. Test results with errors relating to connections of the standard connector are linked via the associated connection list of the match's outline diagram to the individual components. The outline diagram is displayed and printed with the defective components highlighted. Use of the identification system to select the best test algorithm and test parameter setup is disclosed. Connection to and operation with automatic handler systems is also disclosed.

25 Claims, 4 Drawing Sheets

COMPONENT IDENTIFICATION SYSTEM FOR ELECTRONIC BOARD TESTERS

CROSS-REFERENCE TO RELATED APPLICATIONS

Not applicable.

BACKGROUND

1. Field of the Invention

The present invention relates, in general, to the field of automatic test equipment, and more specifically to automatic component identification system for electronic board tester that identify the defective components on a failed tested board and to select the best test for testing the board.

2. Description of Prior Art

Many electronic devices come with a variety of interconnection sockets that allow them to be upgraded in capabilities or to add sub-assemblies that will provide additional functionality to the original configuration. For example, personal computers include standard expansion slots like ISA, EISA, and PCI, which allow the manufacturer to configure the system according to customer's requests. After the sale, the expansion slots allow the customers to upgrade their computers by installing new expansion boards with a variety of functionality. In a similar manner, memory manufacturers established standard connections for SIMMs, DIMMs, SO DIMMs and others memory modules, so that computer manufacturers as well as the users are free to select memory modules from a variety of competing sources.

This benefit of using a standard connection was adapted by a large variety of electronic products in the computer industry as well as in telephony and other fields. Thus, in the computer field, many add-on boards from competing manufacturers, like video cards, voice cards, and modems will fit in the expansion slot, in the same way that memory modules with different configurations will fit in the memory expansion sockets.

Memory modules and expansion cards are produced in high volume and require efficient automated test equipment to insure their quality. Such automated test equipment includes a test socket, which is wired in accordance with the relevant connection standard of the tested device. The devices to be tested are manually placed by the operator in the test socket or an automatic device handler may do the feeding and the placement of the device in the test socket. After the test process, the good devices that pass the test are shipped out, while the failed devices are sent back for repair.

For memory modules, it is possible to manufacture a module of a given size and data width using several different components. Similarly, video cards with the same capabilities can be made using different components. And sometimes, the same manufacturer has to produce the devices with different components due to shortages or other market conditions. Therefore, if a tester connected to the device finds errors, the tester will mark the device as defective, but will not be able to properly identify the defective components, unless the operator of the tester manually selects the actual configuration.

When tested on an automatic tester, memory devices with different configurations but with the same electronic structure of size and data width will behave exactly the same functionally. Therefore, commercially available memory testers like the "SIMCHECK II" use a variety of functional tests to identify the electronic structure of the module, and once an error is encountered, the tester provides an indication on which connection pin of the module the error was detected. A technician then needs to trace the connection pin to the actual defective chip to be repaired. To eliminate this time consuming task, memory testers have been adapted to store drawings of the tested module associated with connection lists. Before the test starts, the operator must select the device to be tested from a list of stored diagrams. When an error is detected, the diagram of the tested module appears on the screen and shows the defective device. Of course, this method is particularly susceptible to operator errors. When a variety of different modules are being tested interchangeably, operator errors in selecting the correct module drawing will clearly defeat the ability to identify the defective components correctly.

The correct and automatic identification of the tested device is also critical for the selection of the fasted and most reliable test algorithm and test parameters setup. For example, while two memory modules have the same size of 64M×64, one can be made of 64M×8 chips and the other can be made of 64M×16 chips. These modules can be better tested by two different test routines that are optimized to detect interference inside the individual chips. Therefore, it is clearly very important that the tester is able to identify which memory chips are used in order to select the best test routine.

A variety of automatic device handlers are known to the art of electronic board and device testing. Such a device handler accepts a quantity of boards or modules to be tested in an input tray and feeds them sequentially to the test socket site that is connected to the tester. Based on the test result of the tester, the tested boards are further conveyed to different containers, at least one is reserved for the failed boards. One of the problems associated with such automatic device handlers is that the proper marking of the exact defective components on the failed boards require an exact identification of the board.

BRIEF SUMMARY OF THE INVENTION

With these problems in mind, the present invention seeks to provide an automatic component identification system for tester of electronic boards with a standard connector. Such system insures that errors encountered at the standard connector level are correctly attributed to the defective individual components that are causing the error. The automatic tester, which includes an interface to the tested device, a computer, and a display, is connected to two small cameras placed in front and behind the tested device. Images of both sides of the tested board are captured by the cameras and digitized for a transfer to the computer. The computer employs pattern recognition and visual processing techniques to analyze and to extract an outline diagram of the shapes of the components placed on both sides of the board. The computer compares the extracted outline diagram with a supplied and updated database of outline diagrams of known boards until a match is found. The stored outline diagram, which is matched to the currently tested module, is further linked to a connection list that maps all the individual components on the tested board to specific connections of the standard connector.

Errors found by the test equipment, which relates to specific connections of the standard connector, are matched by the connection to the defective components. The computer displays the extracted outline diagram with highlights placed on the defective components. It also prints a report showing the captured picture of the tested device with proper markings to indicate the defective components.

It is therefore an object of the present invention to automatically identify the outline diagram of the tested electronic board so that the actual defective components are explicitly identified.

It is a further object of the present invention to provide an automatic identification of the structure of a tested electronic board to select the most appropriate test algorithm and test parameters setup.

It is still a further object of the present invention to provide an exact marking of the defective components of electronic boards tested with an automatic device handler.

These and other objects, advantages, and features shall hereinafter appear, and for the purpose of illustrations, but not for limitation, exemplary embodiments of the present invention are described in the following detailed description and illustrated in the accompanying drawings in which like reference numerals designate corresponding elements.

BRIEF DESCRIPTION OF THE DRAWINGS

In the drawings, closely related figures have the same number but different alphabetic suffixes.

DETAILED DESCRIPTION OF THE INVENTION

The present invention discloses a method and a system to improve automatic test equipment for various electronic boards with a common connector so that defective components on the board are clearly identified without user intervention. The tested board is also explicitly identified so that the best test algorithm and approved test parameters setup can be selected automatically.

Such electronic boards include a printed circuit board (PCB) that carries components on both sides. Older electronic boards made with through-hole technology typically have mounted components on one side of the PCB that is called the Component Side or Component Layer. The other side of the PCB, which is called the Solder Side or the Solder Layer, is used to solder the pins of the components. Modern electronic boards now use surface mount technology that enables the manufacture to mount the components on both sides of the PCB.

Figure 1A:
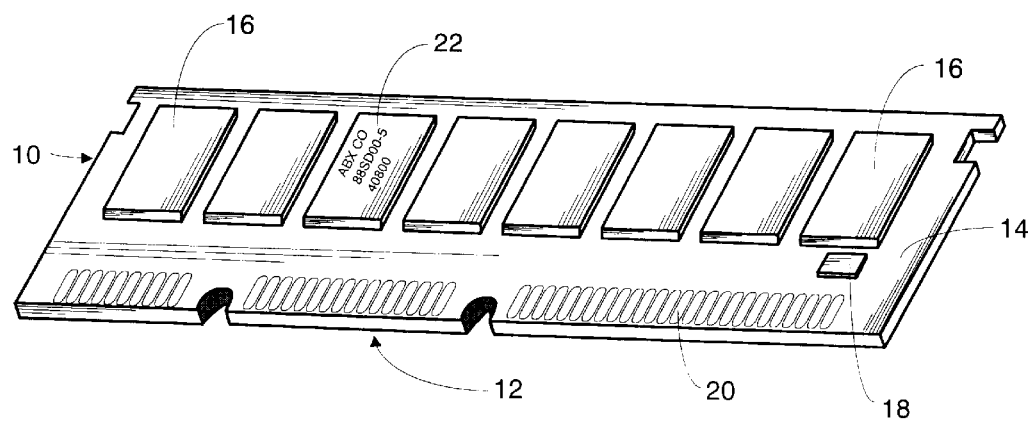
FIG. 1A and FIG. 1B show the shape of two memory modules that have the same size and data width but they are made from different components.

As explained in the discussion of the prior art, there are many types of electronic boards with a standard connection that can be tested with test systems improved with the present invention. Memory modules are an excellent example for such electronic boards. FIG. 1A shows a memory module 10 with a standard connector 12. The memory module 10 is made of a multi-layer PCB 14 that carries a plurality of memory devices 16 and other components 18 on both sides of the PCB. The memory module is identified according to its overall size, data width, number of banks, the technology it uses, e.g. SDRAM, DRAM, etc., and other parameters. The components are marked by their manufacturer with a device marking 22 that typically lists the manufacturer, the device name, speed or other parametric grade, and the manufacture code. For clarity purposes, only one component is shown with the marking 22 although all the memory chips and most of the other components are similarly marked.

Figure 1B:
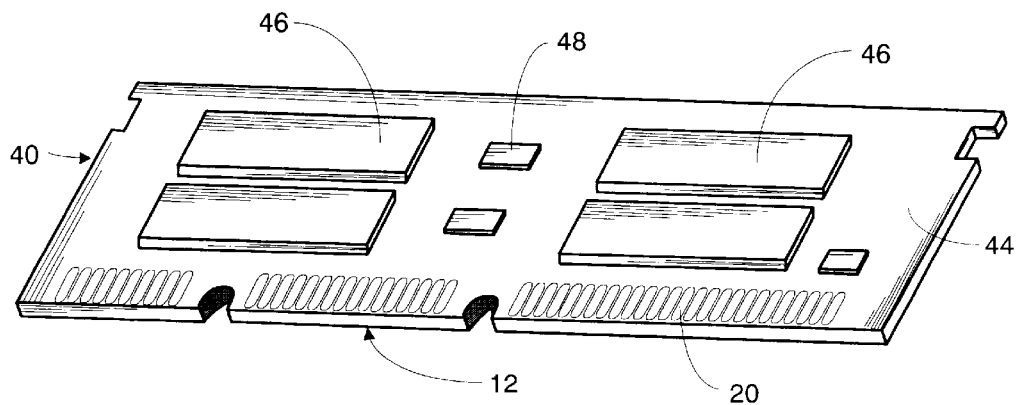

FIG. 1B shows another memory module 40 with exactly the same size, data width and number of banks as the module 10. It also has the same type of connector 12 but it is built on a different PCB 44 and carries different types of memory chips 46 and components 48. Both modules 10 and 40 may also have components on the backside, which are not shown in the drawing.

Automatic memory testers of the prior art will identify the size, data width, the number of banks, and the technology of the modules. However, such testers will not identify the actual component arrangement. In fact, both modules 10 and 40 will appear identical to such testers although it is clear from their drawings that they use different types of components as well as a different number of components. Therefore, if an error is found during the test, the tester will identify the error as relating to a data bit connected to one of the connections 20 of the standard connector 12, e.g. connection pad #50. In fact, the tester cannot identify the actual defective component that causes the error.

Figure 2:
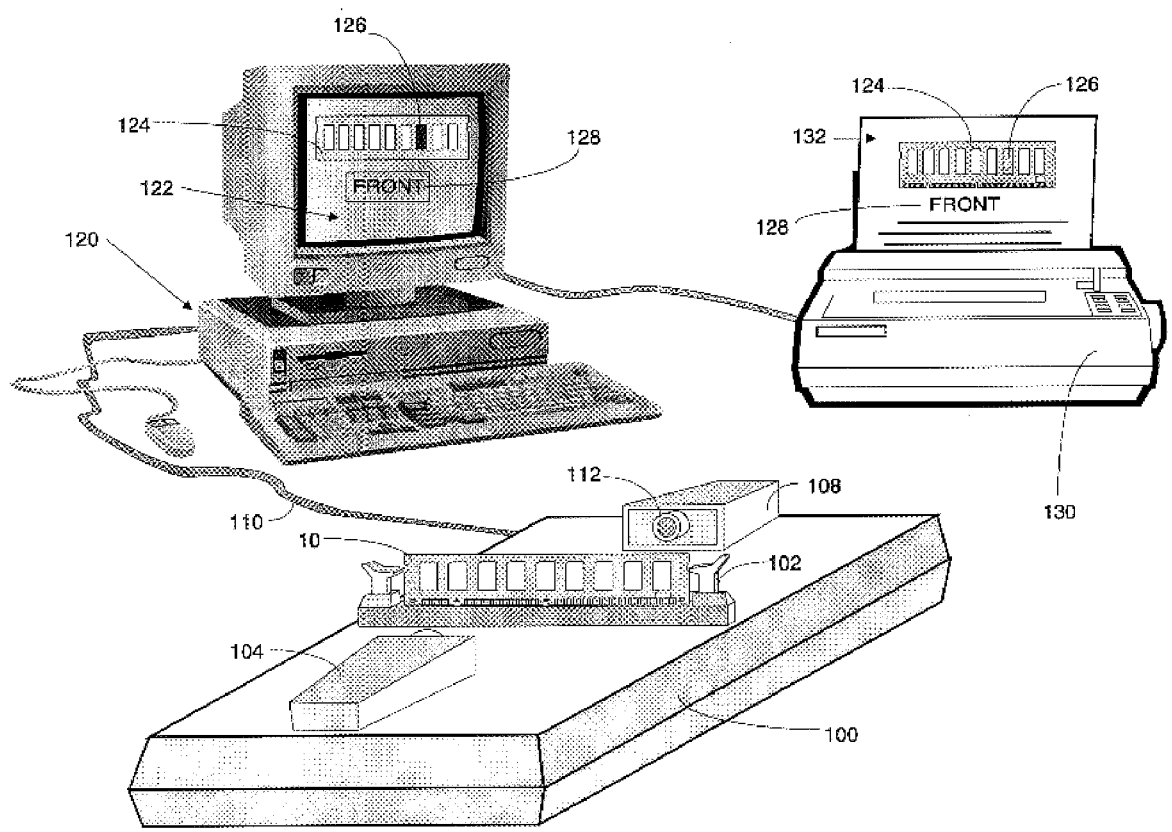
FIG. 2 shows the embodiment of an automatic device tester with a component identification system in accordance with the present invention.

FIG. 2 illustrates the embodiment of the present invention. A tester 100 uses a test socket 102 to connect to the tested electronic board, for example, the memory module 10. Two CCD Cameras, 104 and 108 are placed in front and behind the tested module in positions that allow the cameras to capture images of the entire front and back sides of the tested module 10. The cameras may use an adequate optical lens 112 adapted for close range image capture.

The tester 100 is interfaced to a computer 120 that has a display 122. The computer is the main processing means for the system and is shown here as a separate unit. It should be clear to anyone familiar with the art that the entire tester system and the computer may be integrated in one system, and even housed in one enclosure. The tester may also be attached to an automatic device handler or in fact be a part of such device handler. The device handler feeds the tested boards to the test socket and then follows the test results to convey the tested devices to different output storage compartments. If an automatic device handler is used, the cameras 104 and 108 can be placed along the path through which the tested boards are conveyed to the test socket in positions selected to allow good image captures. The computer software includes a stored list of outline diagrams showing the mechanical placement of components on both sides of the tested boards. Each outline diagram corresponding to a known tested board is further associated with a connection list that indicates the connections from each component on the outline diagram to the specific connections of the standard connector 12. In some embodiments of the present invention, each outline diagram is also associated with an approved test parameter setup and a selection of specific test algorithms that are optimized to test the electronic board of the associated outline diagram. The manufacturer provides these outline diagrams and associated connection lists for popular boards to be tested. The manufacturer can periodically send updated lists via the Internet. The operator can further setup the simplified outline diagram and the associated connection list for new boards to be tested using a graphic setup routines and edit modes preferably provided by the test program.

At the start of the test, the cameras 104 and 108 capture images of the tested module 10. The images are transferred to the computer where they are analyzed using pattern recognition and edge detection techniques to extract a pair of outline diagrams depicting the shape of both sides of the module, including the outlines of the mounted components. The computer compares the pair of the extracted outline diagrams to the stored database until a match is found. A match does not need to be exact, as some components may have a different impact on the difference between the tested boards. For example, more capacitors on a memory module do not change its size or structure. Therefore, the match algorithm may be limited only to critical components, determined by the board designer, with an auxiliary list depicting the critical components for the determination of match. If no match is found, the system may prompt the operator to setup the stored list to include the new board.

Once a match is found, the test system may select the best test algorithm and test parameter setup associated with the match to test the module 10. Other embodiments of the present invention may not use the identification of the module to select the test and the tester starts the standard test. If an error is detected during the test, the test circuitry will first identify the error in relation to specific connections of the test socket 102. The computer will then use the associated connection list of the match to infer which actual component is causing the error. It will then display the extracted diagram 124 of the side of the module on which the defective component is mounted. It will highlight the defective component 126 by a different color, shade, video blinking or other marker. In some embodiments of the present invention, the display may show both sides of the tested board with the appropriate captions. If only one side is displayed, the computer will add a caption 128 to the display showing which side of the module carries the defective components. Also, multiple errors can be detected and highlighted on the same display.

The system is optionally connected to a printer 130 that prints a report 132 showing the extracted diagram 124, the highlighted defective component 126 and the side caption 128. This printed report can be attached to the failed board when it is shipped to the repair department. If the test system uses an automatic device handler, the report can be printed using a small drawing scale on a sticker that is attached automatically to the defective module. Alternatively, a pair of print heads can be placed along the path of the bad modules and attach miniature stickers or impact markings on defective chips detected by the systems on both sides of the module.

To assist the identification of the simplified outline diagram of the tested board, the captured component images can be used to extract the marking 22 on such components using standard character recognition techniques. The marking on a component typically lists the manufacturer, the device name, speed or other parametric grade, and the manufacture code. Information read from the marking on the devices can be used to assist in the identification of the devices.

Figure 3:
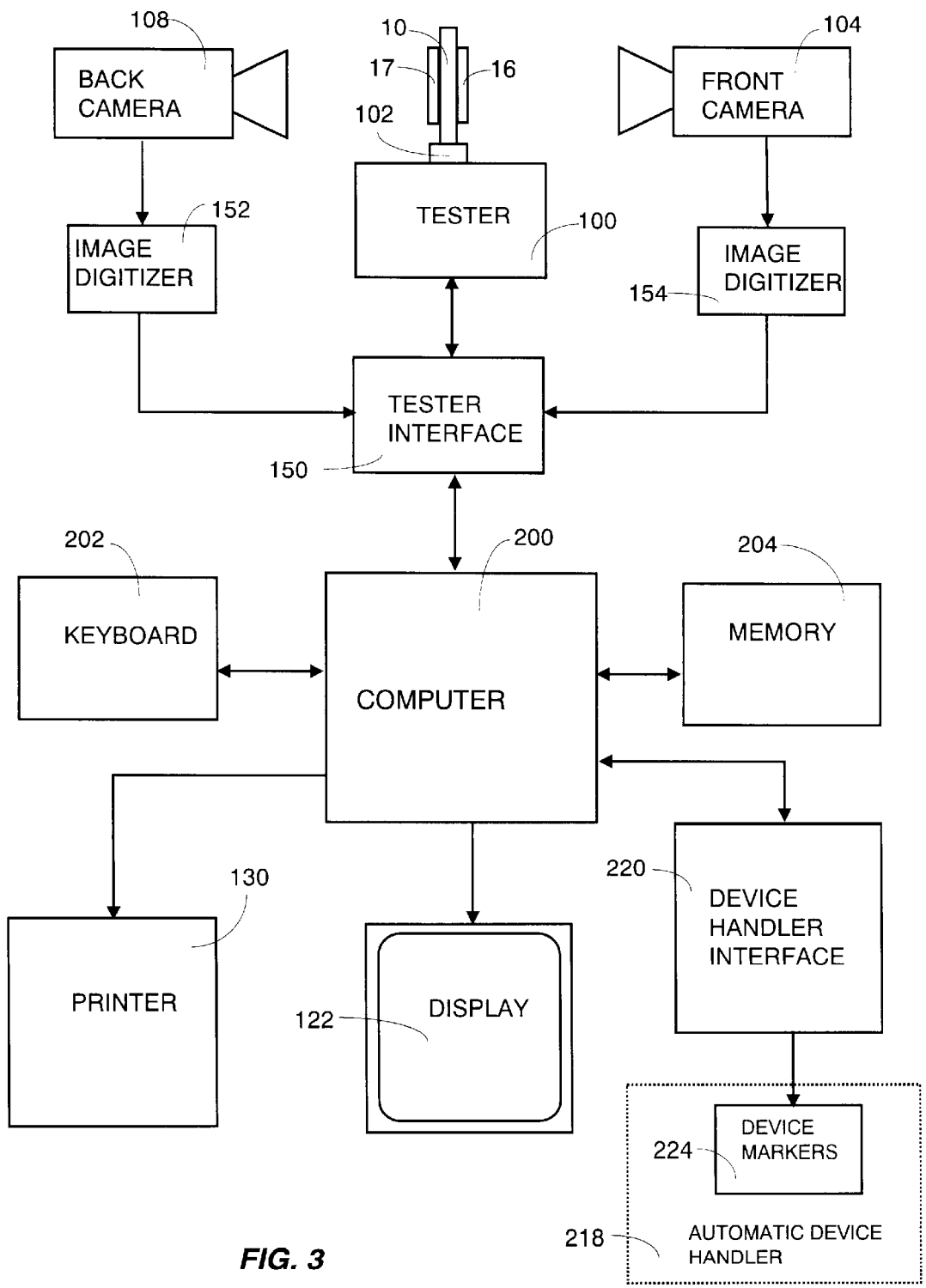
FIG. 3 is a block diagram of the present invention.

FIG. 3 is a schematic block diagram of automatic test system that utilizes the identification system of the present invention. The electronic board 10 to be tested is inserted into the test socket 102 of the tester 100. The front camera 104 captures the image of the front side of the board 10. Similarly, the back camera 108 captures the image of the backside of the board. The computer 200 via the tester interface 150 controls the operation of the tester 100. It should be noted again that in some embodiments of the present invention, the tester may have computing means to run its test algorithm, and to communicate with external computer for overall control, user interface and reporting means. Such typical arrangement is the "SIMCHECK II" tester. Other embodiments of the tester 100 portion may be limited to signal generators and converters without computing circuitry.

The captured images are digitized by the image digitizer 152 and 154 and sent to the computer 200 via the tester interface 150. The operator controls the computer by the keyboard 202. The computer programs are stored by the memory 204 means which also includes the database of the outline diagrams and its associated connection lists and selected test algorithm and test parameter setup.

When the module is placed in the socket 102 and the test starts, the computer 200 accepts the captured images and extracts the outline diagrams. It then compares the extracted outline diagram to the database in memory 204 until a match with a known board's outline diagram is achieved. The computer 200 then selects the associated test algorithm and setup to run the test via the tester interface 150 and the tester 100. If the test encounter errors, the tester 100 provides the computer 200 with data to determine on which connections of the test socket 102 the errors were related. The computer 200 then uses the connection list stored in the memory 204 and associated to the matched electronic board to determine the actual defective components. It then processes the extracted outline diagram in the memory 204 to highlight the defective components. The processed outline diagram is shown on the display 122 and printed on the printer 130.

If the test system incorporates an automatic device handler 218, the device handler is interfaced to the computer via the device handler interface 220. The automatic device handler notifies the computer when the module is inserted in the test socket 102 and it activates the image captures by cameras 104 and 108 at the appropriate time. The computer instructs the device handler where to send the tested modules according to the test results. If an error is detected, the computer instructs the device handler to print error makers on the defective components using the device markers 224. The device markers are placed on the module path so that they can use the extracted outline diagram and the identification of defective components to mark the defective components.

Figure 4:
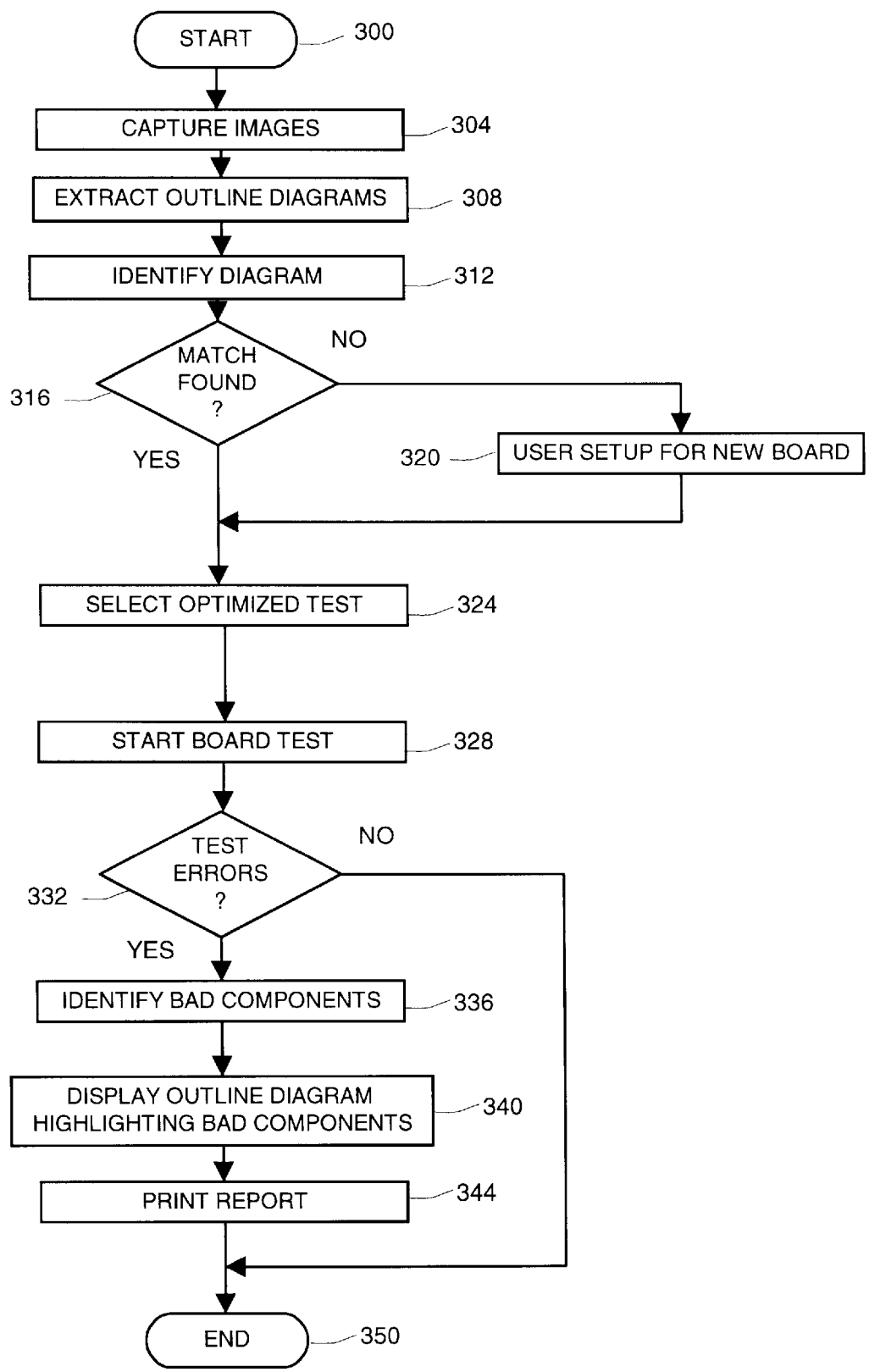
FIG. 4 depicts the flow diagram of the process for identifying the defective components of the tested electronic board in accordance with the present invention.

FIG. 4 is the flow diagram of the process of the automatic test system that utilizes the identification system of the present invention. The process starts at block 300 in response to the operator's command or it starts in response to a start signal issued by the automatic device handler 218. The process captures the images of the front and the back sides of the module at block 304, and analyzes the captured images to extract an outline diagram of the board and its components in block 308. The process then tries to match the extracted outline diagram of the tested board to its stored database of outline diagrams in block 312. If a match is not found at block 316, the process prompts the user to setup the new board at step 320. The setup is done using standard schematic capture and drawing editing techniques, and it includes also a selection of tests to be associated with the board. It should be noted that the manufacturer of the system that utilizes the present invention may select to provide custom services of setting up new boards, so step 320 is only an optional step.

Once a match is found or a new board is set in the database, the process starts the board test at block 324 by selecting an optimized test algorithm and test setup that is linked to the identified board under test. If no errors are found at the end of the test in block 332, the test ends at block 350, reporting the success of the test to the operator or to the automatic device handler. If errors are found at the end of the test, block 332 notifies the computer by providing it with an explicit list of error associated with specific connections of the board connector. Using the match found in block 316, and the associated connection list, the process at block 336 correlates the explicit error list to specific defective components in the outline diagram of the match.

The process then displays the outline diagram at block 340 and highlights the defective components identified in block 336. If a printer is connected to the system, the process prints an error report at block 344 that shows the captured highlight diagram and the highlighted defective components. The system may use an automatic device handler equipped with special printer heads to physically mark the defective components. In such a case, the process at block 344 provides information to the handler to calculate the exact time during which the defective components passes under the printer heads and to activate the printer heads to mark the defective components.

Although the description above contains many specifications, these should not be construed as limiting the scope of the invention but as merely providing illustrations of some of the presently preferred embodiments of this invention.

Thus the scope of the invention should be determined by the appended claims and their legal equivalents, rather than by the examples given.

What I claim as my invention is:

1. A method for correlating error results of functional tests with specific defective components on an electronic board with a standard connector, said electronic board is carrying a plurality of components on at least one side, the method comprising the steps of:

inserting said electronic board in a test socket adapted to connect to said standard connector;

acquiring a first image of the front side of said electronic board and providing image data comprising of bits representing each picture element of said first image;

acquiring a second image of the back side of said electronic board and providing image data comprising of bits representing each picture element of said second image;

analyzing said binary data to extract an outline diagram representing the shapes of said electronic board and all components on both sides of said board;

identifying correlating said extracted outline diagram by comparing it to a database of outline diagrams of known electronic boards until a matched outline diagram is found, each said outline diagrams of said database is further linked to a connection list associating each component shape of the diagram to individual connections on said standard connector;

functional testing said electronic board via said test socket and identifying test errors associated with said individual connections of said standard connector; and defective components connected to said individual connections associated with errors in said testing step using said connection list of said matched outline diagram.

2. The method as defined in claim 1, wherein said step of correlating defective components includes adding highlight markers around said defective components on said extracted outline diagram of said electronic board and displaying the highlighted diagram on a display.

3. The method as defined in claim 1, wherein said step of correlating defective components includes adding highlight markers around said defective components on said extracted outline diagram of said electronic board and printing the highlighted image on a printer.

4. The method as defined in claim 1, wherein said analyzing step further comprises character recognition on said images data to capture the device markings on said components, wherein said database of outline diagrams associates a list of approved markings for each component, and wherein the step of correlating said extracted outline diagram further comprises matching said captured components markings to said associated list of approved markings.

5. The method as defined in claim 1, wherein an automatic device handler does said inserting step.

6. The method as defined in claim 5, wherein said step of correlating defective components includes outputting activation signals to printer heads on said automatic device handler so that said printer heads marks said identified defective components as they pass near said printer heads.

7. The method as defined in claim 1, wherein said acquisition of first and second images is done by a pair of CCD cameras placed in a fixed position in front and behind said test socket whereby first camera capture a full image of the front side of said electronic board and second camera capture a full image of the back side of said electronic board.

8. The method as defined in claim 1, wherein said electronic board is a memory module.

9. The method as defined in claim 1, wherein said correlating step further includes the step of setting up the outline diagram and associated connection list for a new electronic board by the operator if said electronic board cannot be matched automatically to any one of said outline diagrams in said database.

10. A method for selecting the optimal test from a database of multiple functional tests for testing an electronic board with a standard connector, said electronic board is carrying a plurality of components on at least one side, the method comprising the steps of:

inserting said electronic board in a test socket adapted to connect to said standard connector;

acquiring a first image of the front side of said electronic board and providing image data comprising of bits representing each picture element of said first image;

acquiring a second image of the back side of said electronic board and providing image data comprising of bits representing each picture element of said second image;

analyzing said binary data to extract an outline diagram representing the shapes of said electronic board and all components on both sides of said board;

identifying said extracted outline diagram by comparing it to a database of outline diagrams of known electronic boards until a matched outline diagram is found, each said outline diagram of said database is further linked to an optimal test comprising a set of test algorithms and test parameter setup for functional testing the electronic board represented by said outline diagram;

activating said optimal test whereby said electronic board is tested using said test algorithms and test parameter setup linked to said matched outline diagram.

11. The method as defined in claim 10, wherein said analyzing step further comprises character recognition on said images data to capture the device markings on said components, wherein said database of outline diagrams associates a list of for each component, and wherein the step of identifying said extracted outline diagram further comprises matching said captured components markings to said associated list of approved markings.

12. The method as defined in claim 10, wherein said identification step further includes the step of setting up the outline diagram and associated connection list for a new electronic board by the operator if said electronic board cannot be matched automatically to any one of said outline diagrams in said database.

13. The method as defined in claim 10, wherein an automatic device handler does said inserting step.

14. The method as defined in claim 10, wherein said acquisition of first and second images is done by a pair of CCD cameras placed in a fixed position in front and behind said test socket whereby first camera capture a full image of the front side of said electronic board and second camera capture a full image of the back side of said electronic board.

15. The method as defined in claim 10, wherein said electronic board is a memory module.

16. A test system for an electronic board with a standard connector, said electronic board is carrying a plurality of components on at least one side, the system comprising:

a test socket adapted to connect to said standard connector;

functional testing means connected to said test socket adapted to test said electronic board;

computing means interfaced with said functional testing means, said computing means is adapted to receive test results from said functional testing means, said test results associate any detected errors on defective electronic board to individual connections of said standard connector;

an image acquisition means for capturing images of both sides of said electronic board, said image acquisition means is further adapted to provide an image data comprising bits representing each picture element of said images, said image acquisition means is further connected to said computing means, said computing means is further adapted to analyze said image data and to extract an outline diagram representing the shapes of said electronic board and all components on both sides of said board, said computing means is further adapted to store a database of outline diagrams of known electronic boards, each said outline diagrams of said database is further linked to a connection list associating each component shape of the outline diagram to individual connections on said standard connector; and said computing means is further adapted to compare said extracted outline diagram representing the electronic board to said database until a matched outline diagram is found, said connection list linked to said matched outline diagram is used to correlate said detected errors from individual contacts of said test socket to the defective components connected to said individual contacts whereby the error results of said functional test correlates to specific defective chips.

17. The test system of claim 16, further comprising a display, and wherein said computing means is further adapted to add highlight markers around said defective components on said extracted outline diagram of said electronic board and displaying the highlighted diagram on said display.

18. The test system of claim 16, further comprising a printer, and wherein said step of identifying defective components includes adding highlight markers around said defective components on said extracted outline diagram of said electronic board and printing the highlighted image on a printer.

19. The test system of claim 16, wherein said computer means Is further adapted to use character recognition techniques on said images data to capture the device markings on said components, wherein said database of outline diagrams associates a list of approved markings for each component of a known electronic board in said database, and wherein said computing means is further adapted to match said captured component markings to said associated list of approved markings.

20. The test system of claim 16, further comprising an automatic device handler to convey tested electronic boards to said test socket and to channel said electronics board to various containers in response to test results from said computing means.

21. The test system of claim 20, wherein said automatic device handler further comprises a plurality of printing heads adapted to mark individual components on said electronic board, and wherein said computing means is further adapted to output activation signals to said printer heads to mark said identified defective components as they pass near said printer heads.

22. The test system of claim 16, wherein each outline diagram of said database is further linked to test algorithms and test parameter setup optimized to test the electronic board represented by said outline diagram, and wherein said computing means is further adapted to select said test algorithms and test parameter setup associated with said matched outline diagram of the said electronic board whereby said electronic board is automatically tested using the optimal functional test.

23. The test system of claim 16, wherein said computing means is further adapted to prompt the operator and to provide graphic and editing routines to setup an outline diagram and associated connection list for a new electronic board that cannot be found matched with an outline diagram in said database.

24. The test system of claim 16, wherein said image acquisition means comprises a pair of CCD cameras placed in a fixed position in front and behind said test socket whereby first camera capture a full image of the front side of said electronic board and second camera capture a full image of the back side of said electronic board.

25. The test system of claim 16, wherein said electronic board is a memory module.

* * * * *